United States Patent
Kuo et al.

(10) Patent No.: US 8,044,721 B2
(45) Date of Patent: Oct. 25, 2011

(54) LOW NOISE AMPLIFIER

(75) Inventors: Ming-Ching Kuo, Chiayi County (TW); Chien-Nan Kuo, Pingtung County (TW); Shiau-Wen Kao, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 168 days.

(21) Appl. No.: 12/535,699

(22) Filed: Aug. 5, 2009

(65) Prior Publication Data

US 2010/0308914 A1 Dec. 9, 2010

(30) Foreign Application Priority Data

Jun. 8, 2009 (TW) .............................. 98119055 A

(51) Int. Cl.
*H03F 3/04* (2006.01)
(52) U.S. Cl. ............... 330/301; 330/253; 330/261
(58) Field of Classification Search .................. 330/301, 330/253, 261
See application file for complete search history.

(56) References Cited

U.S. PATENT DOCUMENTS

| | | | | |
|---|---|---|---|---|
| 5,936,466 A | * | 8/1999 | Andoh et al. | 330/253 |
| 5,945,880 A | * | 8/1999 | Souetinov | 330/311 |
| 5,982,234 A | * | 11/1999 | Compagne | 330/149 |
| 6,366,171 B1 | * | 4/2002 | Litmanen et al. | 330/301 |
| 7,098,742 B2 | | 8/2006 | Johnson | |
| 7,555,263 B1 | * | 6/2009 | Rofougaran et al. | 455/20 |
| 7,834,698 B2 | * | 11/2010 | Sengupta et al. | 330/261 |
| 2008/0238545 A1 | * | 10/2008 | Sauer | 330/255 |
| 2009/0108935 A1 | * | 4/2009 | Kuo et al. | 330/254 |

OTHER PUBLICATIONS

Authored by Kuo, et al., article titled "Wideband LNA Compatible for Differential and Single-Ended Inputs," adopted from IEEE Microwave and Wireless Components Letters, vol. 19, No. 7, Jul. 2009, pp. 482-484.

Authored by: Vassiliou, et al., article titled "A 65 nm CMOS Multistandard, Multiband TV Tuner for Mobile and Multimedia Applications", Solid-State Circuits of IEEE Journal, vol. 43, Issue, 7, Jul. 2008, pp. 1522-1533.

* cited by examiner

*Primary Examiner* — Patricia Nguyen
(74) *Attorney, Agent, or Firm* — Jianq Chyun IP Office

(57) ABSTRACT

A low noise amplifier including an amplifier kernel circuit and a DC bias unit is provided. The amplifier kernel circuit is used for receiving a single input signal or a differential input signal so as to output a differential output signal. The DC bias unit is coupled to the amplifier kernel circuit, and is used for processing a signal source to generate the single input signal or the differential input signal according to its circuit configuration.

19 Claims, 4 Drawing Sheets

LOW NOISE AMPLIFIER

CROSS-REFERENCE TO RELATED APPLICATION

This application claims the priority benefit of Taiwan application serial no. 98119055, filed on Jun. 8, 2009. The entirety of the above-mentioned patent application is hereby incorporated by reference herein and made a part of specification.

TECHNICAL FIELD

The present invention relates to a low noise amplifier.

BACKGROUND

The low noise amplifier (LNA) in a radio frequency (RF) chip with a single receiving or a differential receiving is determined by the product positioning. In other words, after the RF chip is manufactured, the receiving mode of the LNA is either the single receiving or the differential receiving. Therefore, the LNA is incapable of supporting these two receiving modes under the RF chip is manufactured.

SUMMARY

The present disclosure is directed to a low noise amplifier including an amplifier kernel circuit and a DC bias unit. The amplifier kernel circuit is used for receiving a single input signal or a differential input signal so as to generate a differential output signal. The DC bias unit is coupled to the amplifier kernel circuit, and is used for processing a signal source to generate the single input signal or the differential input signal according to its circuit configuration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
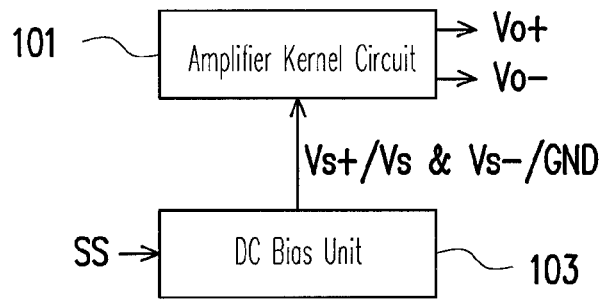
FIG. 1 is a block diagram of a low noise amplifier according to an exemplary embodiment.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a low noise amplifier (LNA) 100 according to an exemplary embodiment. Referring to FIG. 1, the LNA 100 includes an amplifier kernel circuit 101 and a DC bias unit 103. The amplifier kernel circuit 101 is used for receiving a single input signal Vs or a differential input signal Vs+ and Vs− so as to output a differential output signal Vo+ and Vo−, for example, a differential voltage output signal. The DC bias unit 103 is coupled to the amplifier kernel circuit 101, and is used for processing a signal source SS to generate the single input signal Vs (for example, a single voltage input signal, but not limited thereto) or the differential input signal Vs+ and Vs− (for example, a differential voltage input signal, but not limited thereto) according to its circuit configuration.

In the exemplary embodiment, the amplifier kernel circuit 101 and the DC bias unit 103 are not simultaneously implemented on a chip (not shown, for example, an RF is chip, but not limited thereto). To be specific, the amplifier kernel circuit 101 may be implemented on the chip, and the DC bias unit 103 may be implemented using off-chip components (for example, the DC bias unit 103 may be implemented on the PCB). Accordingly, after the RF chip is manufactured, the receiving mode of the LNA 100 may be adaptively changed to a single receiving or a differential receiving by designing the circuit configuration of the DC bias unit 103 in accordance with the product positioning. Therefore, the LNA 100 is capable of supporting the single receiving and the differential receiving under the RF chip is manufactured, namely, the amplifier kernel circuit 101 is not changed.

However, in the other exemplary embodiments, the amplifier kernel circuit 101 and the DC bias unit 103 can be simultaneously implemented on the same chip. In other words, the DC bias unit 103 is not limited to be implemented using off-chip components.

Figure 2:
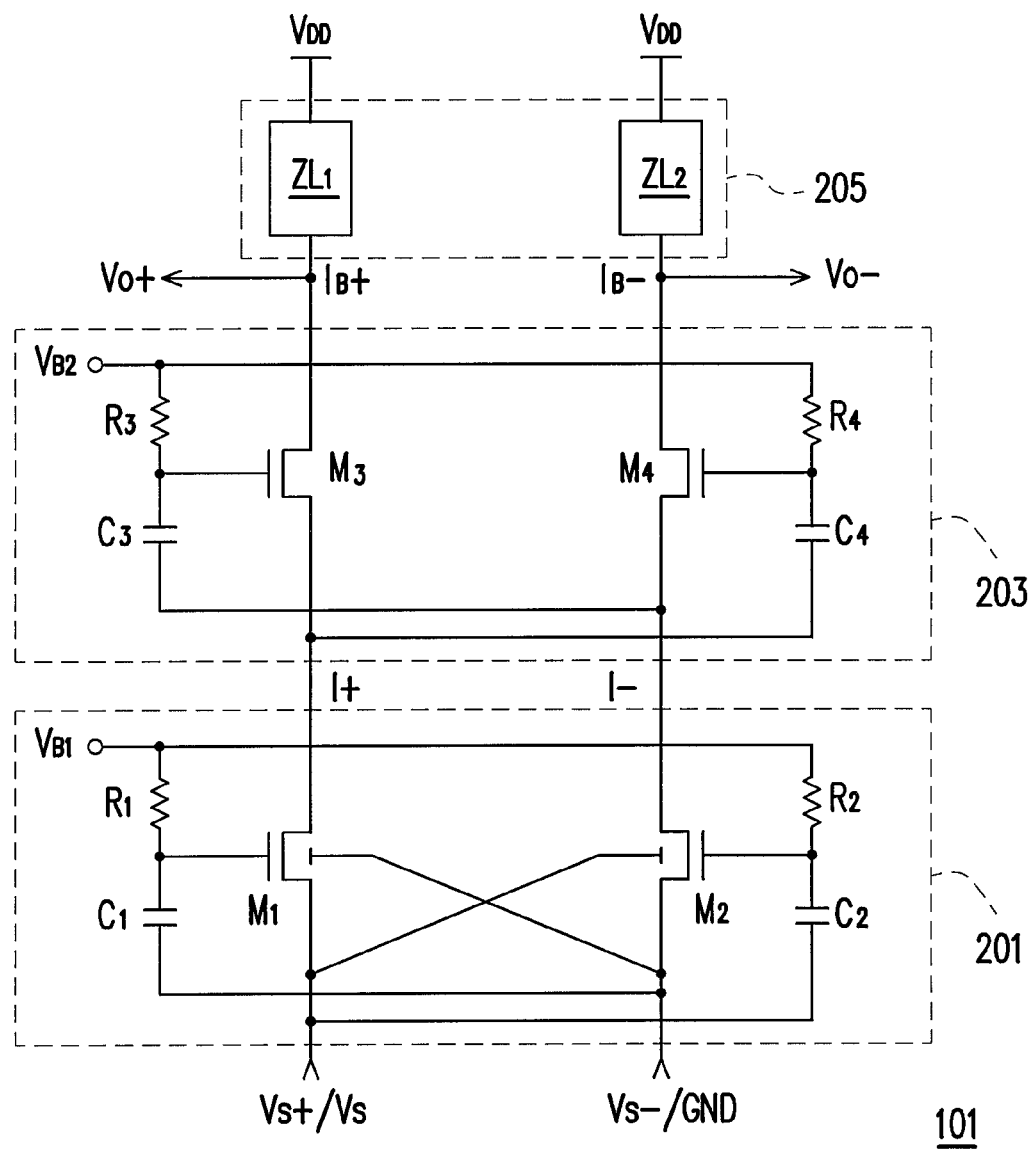
FIG. 2 is a circuit diagram of an amplifier kernel circuit according to an exemplary embodiment.

FIG. 2 is a circuit diagram of the amplifier kernel circuit 101 according to an exemplary embodiment. Referring to FIGS. 1 and 2, the amplifier kernel circuit 101 includes an input transconductance unit 201, a current buffer unit 203 and an output load unit 205. The input transconductance unit 201 is coupled to the DC bias unit 103, and used for receiving and processing the single input signal Vs or the differential input signal Vs+ and Vs− so as to generate a differential current signal I+ and I−. The current buffer unit 203 is coupled to the input transconductance unit 201, and used for receiving and buffering the differential current signal I+ and I− so as to output a buffered differential current signal $I_B+$ and $I_B-$. The output load unit 205 is coupled to the current buffer unit 203, and used for receiving the buffered differential current signal $I_B+$ and $I_B-$ and outputting a differential output signal Vo+ and Vo− accordingly.

To be specific, the input transconductance unit 201 includes two transistors $M_1$ and $M_2$, two resistors $R_1$ and $R_2$, and two capacitors $C_1$ and $C_2$. The gate of the transistor $M_1$ receives a bias voltage $V_{B1}$ through the resistor $R_1$ and is coupled to the source of the transistor $M_2$ through the capacitor $C_1$. The drain of the transistor $M_1$ is used for outputting the positive current signal I+ of the differential current signal I+ and I−. The source of the transistor $M_1$ is used for receiving the single input signal Vs or the positive input signal Vs+ of the differential input signal Vs+ and Vs−.

The gate of the transistor $M_2$ receives the bias voltage $V_{B1}$ through the resistor $R_2$ and is coupled to the source of the transistor $M_1$ through the capacitor $C_2$. The bulk of the transistor $M_2$ is coupled to the source of the transistor $M_1$. The drain of the transistor $M_2$ is used for outputting the negative current signal I− of the, differential current signal I+ and I−.

The source of the transistor $M_2$ is coupled to the bulk of the transistor $M_1$, and used for receiving the negative input signal Vs− of the differential input signal Vs+ and Vs− or coupled to the ground GND through the DC bias unit 103.

In addition, the current buffer unit 203 includes two transistors $M_3$ and $M_4$, two resistors $R_3$ and $R_4$, and two capacitors $C_3$ and $C_4$. The gate of the transistor $M_3$ receives a bias voltage $V_{B2}$ through the resistor $R_3$ and is coupled to the source of the transistor $M_4$ through the capacitor $C_3$. The source of the transistor $M_3$ is coupled to the drain of the transistor $M_1$. The drain of the transistor $M_3$ is used for outputting the positive buffered current signal $I_B$+ of the buffered differential current signal $I_B$+ and $I_B$−. The gate of the transistor $M_4$ receives the bias voltage $V_{B2}$ through the resistor $R_4$ and is coupled to the source of the transistor $M_3$ through the capacitor $C_4$. The source of the transistor $M_4$ is coupled to the drain of the transistor $M_2$. The drain of the transistor $M_4$ is used for outputting the negative buffered current signal $I_B$− of the buffered differential current signal $I_B$+ and $I_B$−.

Furthermore, the output load unit 205 includes two loads $ZL_1$ and $ZL_2$. The first terminal of the load $ZL_1$ is coupled to a system voltage $V_{DD}$ and a second terminal of the load $ZL_1$ is coupled to the drain of the transistor $M_3$ and used for outputting the positive output signal Vo+ of the differential output signal Vo+ and Vo−. The first terminal of the load $ZL_2$ is coupled to the system voltage $V_{DD}$ and, a second terminal of the load $ZL_2$ is coupled to the drain of the transistor $M_4$ and outputting the negative output signal Vo− of the differential output signal Vo+ and Vo−.

Herein, suppose the receiving mode of the LNA 100 is the differential receiving, the circuit configuration of the DC bias unit 103 has several choices in below, but not limited thereto.

Figure 3:
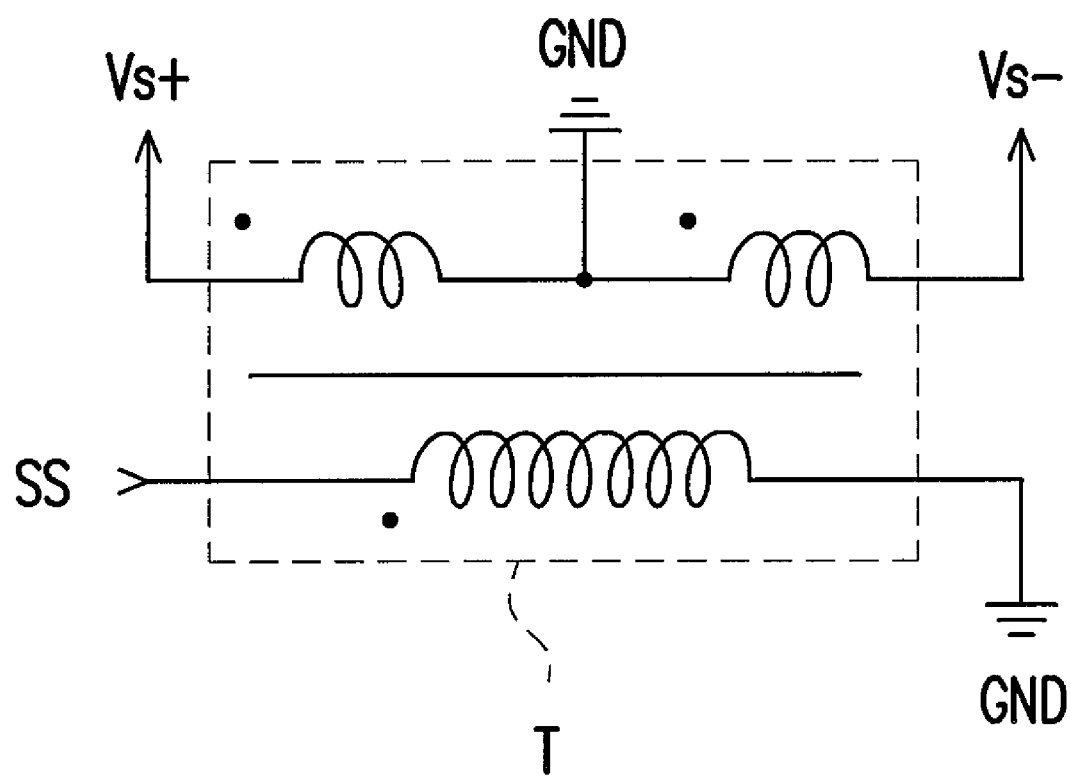
FIGS. 3 through 4C are respectively a circuit diagram of a DC bias unit which may make that the receiving mode of the low noise amplifier is a differential receiving according to an exemplary embodiment.

FIG. 3 is a circuit diagram of the DC bias unit 103 which may make that the receiving mode of the LNA 100 is a differential receiving according to an exemplary embodiment. Referring to FIGS. 1 through 3, the DC bias unit 103 includes a balance-unbalance (Balun) converter T such as a transformer, but not limited thereto. The Balun T has a primary side and a secondary side. The first terminal of the primary side of the Balun T is used for receiving the signal source SS, wherein the signal source SS may be a signal received from an antenna, but not limited thereto.

The second terminal of the primary side of the Balun T is coupled to the ground GND. The first terminal of the secondary side of the Balun T is coupled to the source of the transistor $M_1$ to generate the positive input signal Vs+ of the differential input signal Vs+ and Vs−. The center tap terminal of the secondary side of the Balun T is coupled to the ground GND. The second terminal of the secondary side of the Balun T is coupled to source of the transistor $M_2$ to generate the negative input signal Vs− of the differential input signal Vs+ and Vs−.

Figure 4A:
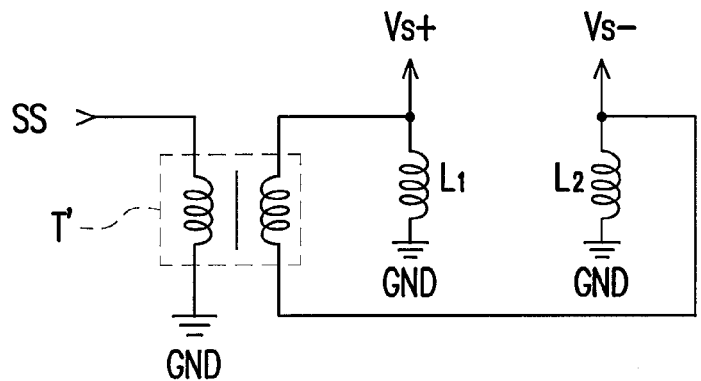

FIG. 4A is a circuit diagram of the DC bias unit 103 which also may make that the receiving mode of the LNA 100 is a differential receiving according to another exemplary embodiment of the present disclosure. Referring to FIGS. 1, 2 and 4A, the DC bias unit 103 includes a balance-unbalance (Balun) converter T' and two inductors $L_1$ and $L_2$, wherein the Balun T' may be a transformer or an element recited in the website of http://en.wikipedia.org/wiki/Balun, but not limited thereto. The Balun T' has a primary side and a secondary side. The first terminal of the primary side of the Balun T' is used for receiving the signal source SS, wherein the signal source SS may be a signal received from an antenna, but not limited thereto.

The second terminal of the primary side of the Balun T' is coupled to the ground GND. The first terminal of the secondary side of the Balun T' is coupled to the source of the transistor $M_1$ to generate the positive input signal Vs+ of the differential input signal Vs+ and Vs−. The second terminal of the secondary side of the Balun T' is coupled to source of the transistor $M_2$ to generate the negative input signal Vs− of the differential input signal Vs+ and Vs−. The first terminal of the inductor $L_1$ is coupled to the first terminal of secondary side of the Balun T', and the second terminal of the inductor $L_1$ is coupled to the ground GND. The first terminal of the inductor $L_2$ is coupled to the second terminal of secondary side of the Balun T', and the second terminal of the inductor $L_2$ is coupled-to the ground GND.

Figure 4B:
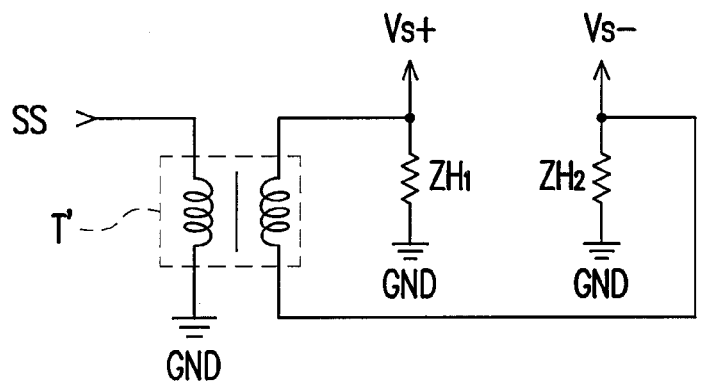

FIG. 4B is a circuit diagram of the DC bias unit 103 which also may make that the receiving mode of the LNA 100 is a differential receiving according to another exemplary embodiment. Referring to FIGS. 4A and 4B, compared FIG. 4A with FIG. 4B, the difference between FIGS. 4A and 4B is that two high impedance elements $ZH_1$ and $ZH_2$ in FIG. 4B would replace the inductors $L_1$ and $L_2$ in FIG.4A. The high impedance elements $ZH_1$ and $ZH_2$ can be a resistor respectively, but not limited thereto.

Figure 4C:
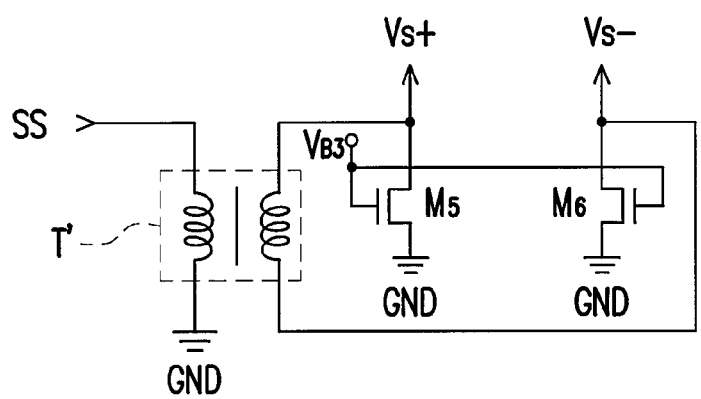

FIG. 4C is a circuit diagram of the DC bias unit 103 which also may make that the receiving mode of the LNA 100 is a differential receiving according to another exemplary embodiment. Referring to FIGS. 4A and 4C, compared FIG. 4A with FIG. 4C, the difference between FIGS. 4A and 4C is that two transistors $M_5$ and $M_6$ in FIG. 4C would replace the inductors $L_1$ and $L_2$ in FIG.4A. The gate of the transistor $M_5$ is used for receiving a bias voltage $V_{B3}$, the drain of the transistor $M_5$ is coupled to the source of the transistor $M_1$, and the source of the transistor $M_5$ is coupled to the ground GND. The gate of the transistor $M_6$ is used for receiving the bias voltage $V_{B3}$, the drain of the transistor $M_6$ is coupled to the source of the transistor $M_2$, and the source of the transistor $M_6$ is coupled to the ground GND.

The DC bias units 103 respectively shown in FIGS. 3 through 4C all can be made that the receiving mode of the LNA 100 is a differential receiving, and the transistors $M_1$ and $M_2$ are both configured as a common gate amplifier at this time. Since the capacitors $C_1$ and $C_2$ are cross-coupled between the gates and sources of the transistors $M_1$ and $M_2$, the transconductance of the transistors $M_1$ and $M_2$ are boosted from $g_m$ to $2*g_m$. Furthermore, the bulks of the transistors $M_1$ and $M_2$ are also cross-coupled, which effectively boosts the transconductance of the transistors $M_1$ and $M_2$ from $g_m$ to $(g_m+g_{mb})$, where $g_{mb}$ is the body transconductance. Therefore, the input transconductance ($g_m$) can be effectively amplified to $2*(g_m+g_{mb})$ under the turns ratio of the Balun T/T' is set to be 1:1. Accordingly, the input impedance ($Z_{in}$) of the LNA 100 with the differential receiving can be approximately seen as $1/(g_m+g_{mb})$, and the voltage gain (Av) is equal to $2*k*(g_m+g_{mb})*ZL$, wherein $k=2*Z_{in}/(Rs+Z_{in})$. The value of k is equal to 1 under the perfect input impedance match with $Z_{in}=Rs=50\Omega$; and ZL is the resistance value of the loads $ZL_1$ and $ZL_2$.

Herein, suppose the receiving mode of the LNA 100 is the single receiving, the circuit configuration of the DC bias unit 103 has several choices in below, but not limited thereto.

Figure 5A:
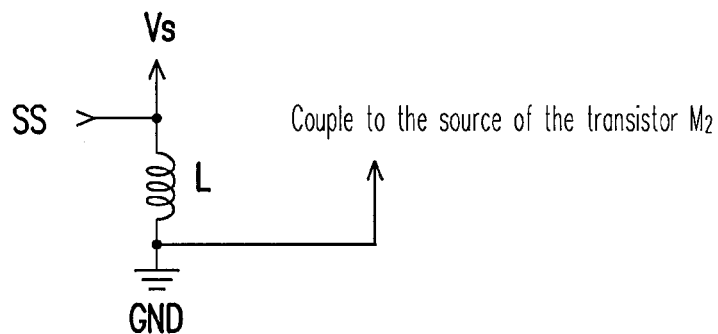
FIGS. 5A through 5C are respectively a circuit diagram of a DC bias unit which may make that the receiving mode of the low noise amplifier is a single receiving according to an exemplary embodiment.

FIG. 5A is a circuit diagram of the DC bias unit 103 which may make that the receiving mode of the LNA: 100 is a single receiving according to an exemplary embodiment. Referring to FIGS. 1, 2 and 5A, the DC bias unit 103 includes an inductor L. The first terminal of the inductor L is used for receiving the signal source SS and is coupled to the source of the transistor $M_1$, and the second terminal of the inductor L is coupled to the ground GND and the source of the transistor $M_2$, wherein the signal source SS may be a signal received from an antenna, but not limited thereto.

Figure 5B:
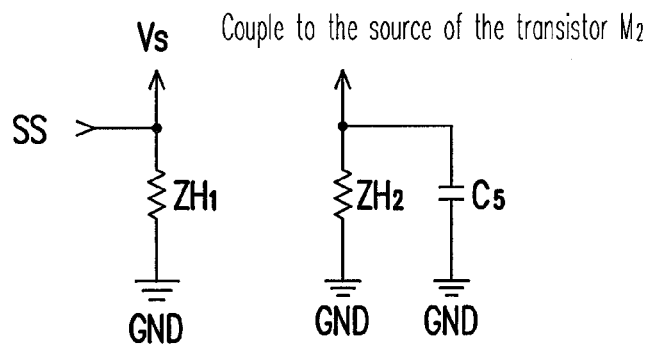

FIG. 5B is a circuit diagram of the DC bias unit 103 which also may make that the receiving mode of the LNA 100 is a single receiving according to another exemplary embodiment. Referring to FIGS. 1, 2 and 5B, the DC bias unit 103 includes two high impedance elements $ZH_1$ and $ZH_2$, and a capacitor $C_5$. The first terminal of the high impedance element $ZH_1$ is coupled to the source of the transistor $M_1$, and the second terminal of the high impedance element $ZH_1$ is coupled to the ground GND. The first terminal of the high impedance element $ZH_2$ is coupled to the source of the transistor $M_2$, and the second terminal of the high impedance element $ZH_2$ is coupled to the ground GND. The capacitor $C_5$ is coupled with the high impedance element $ZH_2$ in parallel. The high impedance elements $ZH_1$ and $ZH_2$ may be a resistor respectively, but not limited thereto.

Figure 5C:
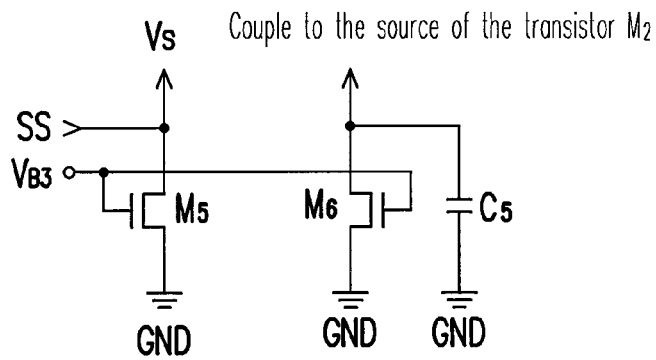

FIG. 5C is a circuit diagram of the DC bias unit 103 which also may make that the receiving mode of the LNA 100 is a single receiving according to another exemplary embodiment of the present disclosure. Referring to FIGS. 1, 2 and 5C, the DC bias unit 103 includes two transistors $M_5$ and $M_6$, and a capacitor $C_5$. The gate of the transistor $M_5$ is used for receiving a bias voltage $V_{B3}$, the drain of the transistor $M_5$ is coupled to the source of the transistor $M_1$, and the source of the transistor $M_5$ is coupled to the ground GND. The gate of the transistor $M_6$ is used for receiving the bias voltage $V_{B3}$, the drain of the transistor $M_6$ is coupled to the source of the transistor $M_2$, and the source of the transistor $M_6$ is coupled to the ground GND. The first terminal of the capacitor $C_5$ is coupled to the source of the transistor $M_2$ and the second terminal of the capacitor $C_5$ is coupled to the ground GND.

The DC bias units 103 respectively shown in FIGS. 5A through 5C all can be made that the receiving mode of the LNA 100 is a single receiving, and the transistors $M_1$ and $M_2$ are respectively configured as a common gate amplifier and a common source amplifier at this time. Since the bulks of the transistors $M_1$ and $M_2$ are cross-coupled, the input transconductance ($g_m$) can be amplified to ($g_m+g_{mb}$). Thus, the parallel common-gate and common-source amplifiers totally contributes an effective transconductance of $2*(g_m+g_{mb})$. Accordingly, the input impedance ($Z_{in}$) of the LNA 100 with the single receiving also can be approximately seen as $1/(g_m+g_{mb})$, and the voltage gain (Av) is also equal to $2*k*(g_m+g_{mb})*ZL$.

Thereunder, whether the receiving mode of the LNA 100 is the single receiving or the differential receiving, the input impedance ($Z_{in}$) and the voltage gain (Av) are not changed. Accordingly, the LNA 100 is capable of supporting the single receiving and the differential receiving by changing the circuit configuration of the DC bias unit 103 under the amplifier kernel circuit 101 is not changed.

Besides, in accordance with the requirements of different product positioning, for example, the develop of product with high performance or low cost and high integration (e.g. SoC) or lower integration (e.g. RF transceiver), the circuit configuration of the DC bias unit 103 can be adaptively changed so as to make that the receiving mode of the LNA 100 can be adaptively changed to the single receiving or the differential receiving.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low noise amplifier, comprising:
   a amplifier kernel circuit, for receiving and processing a single input signal or a differential input signal by adopting a means of bulk-cross-coupling, so as to output a differential output signal; and
   a DC bias unit, coupled to the amplifier kernel circuit, for processing a signal source to generate the single input signal or the differential input signal according to a circuit configuration of the DC bias unit.

2. The low noise amplifier according to claim 1, wherein the amplifier kernel circuit comprises:
   an input transconductance unit, coupled to the DC bias unit, for receiving and processing the single input signal or the differential input signal so as to generate a differential current signal;
   a current buffer unit, coupled to the input transconductance unit, for receiving and buffering the differential current signal so as to output a buffered differential current signal; and
   an output load unit, coupled to the current buffer unit, for receiving the buffered differential current signal and outputting a differential output signal accordingly.

3. The low noise amplifier according to claim 2, wherein the input transconductance unit comprises:
   a first transistor having a gate receiving a first bias voltage, a drain outputting a first current signal of the differential current signal, and a source receiving the single input signal or a first input signal of the differential input signal; and
   a second transistor having a gate receiving the first bias voltage, a bulk coupled to the source of the first transistor, a drain outputting a second current signal of the differential current signal, and a source coupled to a bulk of the first transistor and receiving a second input signal of the differential input signal or coupled to a ground through the DC bias unit.

4. The low noise amplifier according to claim 3, wherein the amplifier kernel circuit further adopts a means of capacitively-cross-coupling to process the single input signal or the differential input signal, and the input transconductance unit further comprises:
   a first resistor having a first terminal receiving the first bias voltage and a second terminal coupled to the gate of the first transistor;
   a first capacitor having a first terminal coupled to the gate of the first transistor and a second terminal coupled to the source of the second transistor;
   a second resistor having a first terminal receiving the first bias voltage and a second terminal coupled to the gate of the second transistor; and
   a second capacitor having a first terminal coupled to the gate of the second transistor and a second terminal coupled to the source of the first transistor.

5. The low noise amplifier according to claim 4, wherein the current buffer unit comprises:
   a third transistor having a gate receiving a second bias voltage, a source coupled to the drain of the first transistor, and a drain outputting a first buffered current signal of the buffered differential current signal; and
   a fourth transistor having a gate receiving the second bias voltage, a source coupled to the drain of the second transistor, and a drain outputting a second buffered current signal of the buffered differential current signal.

6. The low noise amplifier according to claim 5, wherein the current buffer unit further comprises:
- a third resistor having a first terminal receiving the second bias voltage and a second terminal coupled to the gate of the third transistor;
- a third capacitor having a first terminal coupled to the source of the third transistor and a second terminal coupled to the gate of the fourth transistor;
- a fourth resistor having a first terminal receiving the second bias voltage and a second terminal coupled to the gate of the fourth transistor; and
- a fourth capacitor having a first terminal coupled to the source of the fourth transistor and a second terminal coupled to the gate of the third transistor.

7. The low noise amplifier according to claim 6, wherein the output load unit comprises:
- a first load having a first terminal coupled to a system voltage and a second terminal coupled to the drain of the third transistor and outputting a first output signal of the differential output signal; and
- a second load having a first terminal coupled to the system voltage and a second terminal coupled to the drain of the fourth transistor and outputting a second output signal of the differential output signal.

8. The low noise amplifier according to claim 7, wherein the DC bias unit comprises:
- a balance-unbalance (Balun) converter having a primary side and a secondary side, wherein a first terminal of the primary side is used for receiving the signal source, a second terminal of the primary side is coupled to the ground, a first terminal of the secondary side is coupled to the source of the first transistor to generate the first input signal, a center tap terminal of the secondary side is coupled to the ground, and a second terminal of the secondary side is coupled to source of the second transistor to generate the second input signal.

9. The low noise amplifier according to claim 7, wherein the DC bias unit comprises:
- a Balun having primary side and a secondary side, wherein a first terminal of the primary side is used for receiving the signal source, a second terminal of the primary side is coupled to the ground, a first terminal of the secondary side is coupled to the source of the first transistor to generate the first input signal, and a second terminal of the secondary side is coupled to source of the second transistor to generate the second input signal.

10. The low noise amplifier according to claim 9, wherein the DC bias unit further comprises:
- a first inductor having a first terminal coupled to the first terminal of the secondary side and a second terminal coupled to the ground; and
- a second inductor having a first terminal coupled to the second terminal of the secondary side and a second terminal coupled to the ground.

11. The low noise amplifier according to claim 9, wherein the DC bias unit further comprises:
- a first high impedance element having a first terminal coupled to the first terminal of the secondary side and a second terminal coupled to the ground; and
- a second high impedance element having a first terminal coupled to the second terminal of the secondary side and a second terminal coupled to the ground.

12. The low noise amplifier according to claim 9, wherein the DC bias unit further comprises:
- a fifth transistor having a gate receiving a third bias voltage, a drain coupled to the source of the first transistor, and a source coupled to the ground; and
- a sixth transistor having a gate receiving the third bias voltage, a drain coupled to the source of the second transistor, and a source coupled to the ground.

13. The low noise amplifier according to claim 7, wherein the DC bias unit comprises:
- an inductor having a first terminal receiving the signal source and coupled to the source of the first transistor and a second terminal coupled to the ground.

14. The low noise amplifier according to claim 13, wherein the second terminal of the inductor is further coupled to the source of the second transistor.

15. The low noise amplifier according to claim 7, wherein the DC bias unit comprises:
- a first high impedance element having a first terminal coupled to the source of the first transistor and a second terminal coupled to the ground;
- a second high impedance element having a first terminal coupled to the source of the second transistor and a second terminal coupled to the ground; and
- a fifth capacitor coupled with the second high impedance element in parallel.

16. The low noise amplifier according to claim 7, wherein the DC bias unit comprises:
- a fifth transistor having a gate receiving a third bias voltage, a drain coupled to the source of the first transistor, and a source coupled to the ground;
- a sixth transistor having a gate receiving the third bias voltage, a drain coupled to the source of the second transistor, and a source coupled to the ground; and
- a fifth capacitor having a first terminal coupled to the source of the second transistor, and a second terminal coupled to the ground.

17. The low noise amplifier according to claim 1, wherein the single input signal is a single voltage input signal.

18. The low noise amplifier according to claim 1, wherein the differential input signal is a differential voltage input signal.

19. The low noise amplifier according to claim 1, wherein the amplifier is manufactured inside of a chip; and the DC bias unit is manufactured inside or outside of the chip.

* * * * *